United States Patent
Lin et al.

(10) Patent No.: US 7,413,636 B2
(45) Date of Patent: *Aug. 19, 2008

(54) METHOD FOR MANUFACTURING A DUAL SPIN VALVE SENSOR HAVING A LONGITUDINAL BIAS STACK

(75) Inventors: Tsann Lin, Saratoga, CA (US); Daniele Mauri, San Jose, CA (US)

(73) Assignee: Hitachi Global Storage Technologies Netherlands B. V., Amsterdam (NL)

( * ) Notice: Subject to any disclaimer, the term of this patent is extended or adjusted under 35 U.S.C. 154(b) by 603 days.

This patent is subject to a terminal disclaimer.

(21) Appl. No.: 10/692,968

(22) Filed: Oct. 24, 2003

(65) Prior Publication Data

US 2004/0085683 A1    May 6, 2004

Related U.S. Application Data

(62) Division of application No. 10/115,825, filed on Apr. 2, 2002, now Pat. No. 7,161,771.

(51) Int. Cl.
*C23C 14/34* (2006.01)
(52) U.S. Cl. .............................. 204/192.2; 204/192.12; 204/192.15
(58) Field of Classification Search ............ 204/192.12, 204/192.2, 192.15; 427/377
See application file for complete search history.

(56) References Cited

U.S. PATENT DOCUMENTS

| | | | | |
|---|---|---|---|---|
| 5,635,835 | A * | 6/1997 | Mouchot et al. | 324/252 |
| 6,275,363 | B1 * | 8/2001 | Gill | 360/324.2 |
| 6,341,053 | B1 * | 1/2002 | Nakada et al. | 360/324.2 |
| 6,381,105 | B1 * | 4/2002 | Huai et al. | 360/314 |
| 6,590,803 | B2 * | 7/2003 | Saito et al. | 365/158 |
| 6,700,757 | B2 * | 3/2004 | Pinarbasi | 360/324.12 |

\* cited by examiner

*Primary Examiner*—Rodney G McDonald
(74) *Attorney, Agent, or Firm*—Zilka-Kotab, PC (57) ABSTRACT

A dual spin valve (SV) sensor is provided with a longitudinal bias stack sandwiched between a first SV stack and a second SV stack. The longitudinal bias stack comprises an antiferromagnetic (AFM) layer sandwiched between first and second ferromagnetic layers. The first and second SV stacks comprise antiparallel (AP)-pinned layers pinned by AFM layers made of an AFM material having a higher blocking temperature than the AFM material of the bias stack allowing the AP-pinned layers to be pinned in a transverse direction and the bias stack to be pinned in a longitudinal direction. The demagnetizing fields of the two AP-pinned layers cancel each other and the bias stack provides flux closures for the sense layers of the first and second SV stacks.

8 Claims, 7 Drawing Sheets

METHOD FOR MANUFACTURING A DUAL SPIN VALVE SENSOR HAVING A LONGITUDINAL BIAS STACK

This application is a divisional of application Ser. No. 10/115,825 filed on Apr. 2, 2002 now U.S. Pat. No. 7,161,771, entitled "DUAL SPIN VALVE SENSOR WITH A LONGITUDINAL BIAS STACK".

CROSS REFERENCE TO RELATED APPLICATION

U.S. patent application number US 2005/0061658 A1, entitled DUAL MAGNETIC TUNNEL JUNCTION SENSOR WITH A LONGITUDINAL BIAS STACK, was filed on the same day, owned by a common assignee at the time of filing and having the same inventors as the present invention.

BACKGROUND OF THE INVENTION

1. Field of the Invention

This invention relates in general to spin valve magnetic transducers for reading information signals from a magnetic medium and, in particular, to a dual spin valve sensor with a longitudinal bias stack between first and second spin valve stacks of the dual sensor.

2. Description of the Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive (MR) read sensors, commonly referred to as MR sensors, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sense layer varies as a function of the spin-dependent transmission of the conduction electrons between magnetic layers separated by a non-magnetic spacer layer and the accompanying spin-dependent scattering which takes place at the interface of the magnetic and nonmagnetic layers and within the magnetic layers.

GMR sensors using only two layers of ferromagnetic material (e.g., Ni—Fe) separated by a layer of nonmagnetic material (e.g., copper) are generally referred to as spin valve (SV) sensors manifesting the SV effect.

Figure 1:
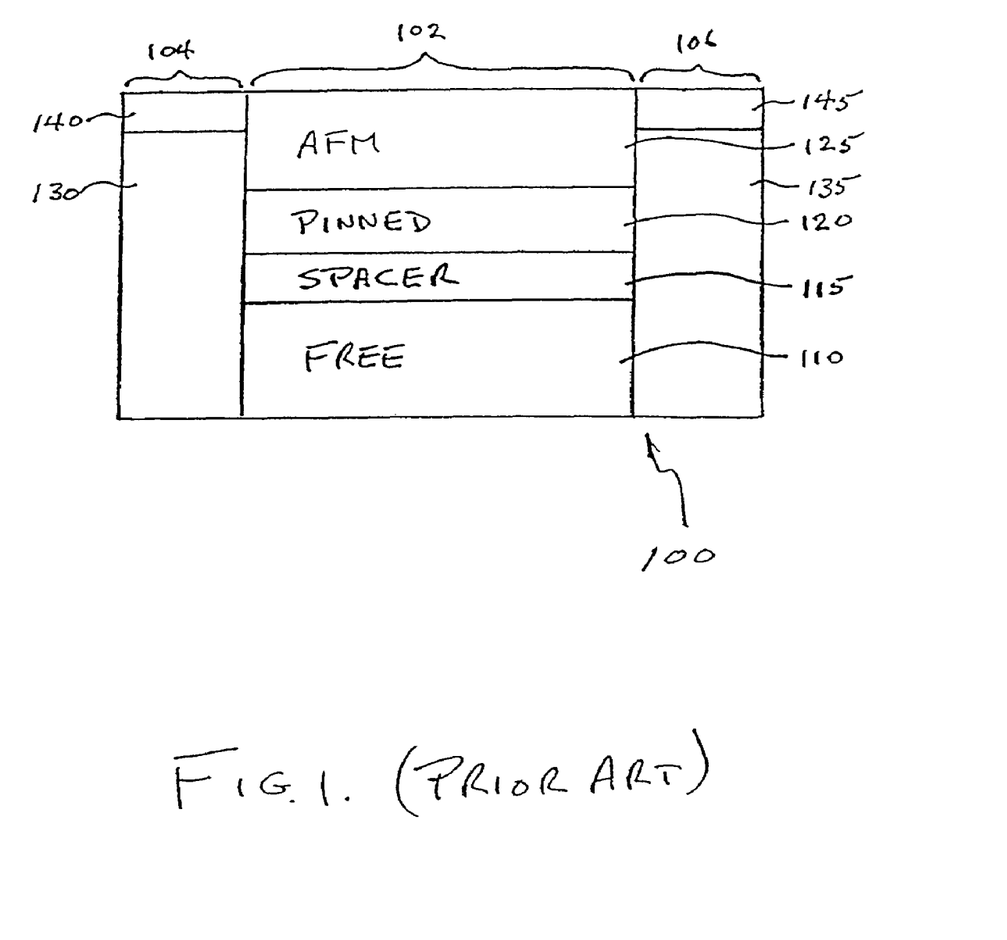
FIG. 1 is an air bearing surface view, not to scale, of a prior art SV sensor.

FIG. 1 shows a prior art SV sensor 100 comprising end regions 104 and 106 separated by a central region 102. A first ferromagnetic layer, referred to as a pinned (or reference) layer 120, has its magnetization typically fixed (pinned) by exchange coupling with an antiferromagnetic (AFM) layer 125. The magnetization of a second ferromagnetic layer, referred to as a free (or sense) layer 110, is not fixed and is free to rotate in response to the magnetic field from the recorded magnetic medium (the signal field). The free layer 110 is separated from the pinned layer 120 by a nonmagnetic, electrically conducting spacer layer 115. Hard bias layers 130 and 135 formed in the end regions 104 and 106, respectively, provide longitudinal bias fields for stabilizing the free layer 110. Leads 140 and 145 formed on hard bias layers 130 and 135, respectively, provide electrical connections for sensing the resistance of SV sensor 100. In the SV sensor 100, because the sense current flow between the leads 140 and 145 is in the plane of the SV sensor layers, the sensor is known as a current-in-plane (CIP) SV sensor. IBM's U.S. Pat. No. 5,206,590 granted to Dieny et al., incorporated herein by reference, discloses a SV sensor operating on the basis of the GMR effect.

Another type of GMR sensor is an antiparallel (AP)-pinned SV sensor. The AP-pinned SV sensor differs from the simple SV sensor in that an AP-pinned structure has multiple thin film layers instead of a single pinned layer. The AP-pinned structure has an antiparallel coupling (APC) layer sandwiched between first and second ferromagnetic pinned layers. The first pinned layer has its magnetization oriented in a first direction by exchange coupling to the antiferromagnetic (AFM) pinning layer. The second pinned layer is immediately adjacent to the free layer and is antiparallel exchange coupled to the first pinned layer because of the minimal thickness (in the order of 8 Å) of the APC layer between the first and second pinned layers. Accordingly, the magnetization of the second pinned layer is oriented in a second direction that is antiparallel to the direction of the magnetization of the first pinned layer.

The AP-pinned structure is preferred over the single pinned layer because the magnetizations of the first and second pinned layers of the AP-pinned structure subtractively combine to provide a net magnetization that is much less than the magnetization of the single pinned layer. The direction of the net magnetization is determined by the thicker of the first and second pinned layers. A reduced net magnetization equates to a reduced demagnetization field from the AP-pinned structure. Since the antiferromagnetic exchange coupling is inversely proportional to the net magnetization, this increases exchange coupling between the first pinned layer and the antiferromagnetic pinning layer. The AP-pinned SV sensor is described in commonly assigned U.S. Pat. No. 5,465,185 to Heim and Parkin which is incorporated by reference herein.

Another type of magnetic device currently under development is a magnetic tunnel junction (MTJ) device. The MTJ device has potential applications as a memory cell and as a magnetic field sensor. The MTJ device comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetizations of the two ferromagnetic layers. In the MTJ sensor, one ferromagnetic layer has its magnetization fixed, or pinned, and the other ferromagnetic layer has its magnetization free to rotate in response to an external magnetic field from the recording medium (the signal field). When an electric potential is applied between the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium because the signal field causes a change of direction of magnetization of the free layer, which in turn causes a change in resistance of the MTJ sensor and a corresponding change in the sensed current or voltage. IBM's U.S. Pat. No. 5,650,958 granted to Gallagher et al., incorporated in its entirety herein by reference, discloses an MTJ sensor operating on the basis of the magnetic tunnel junction effect.

Figure 2:
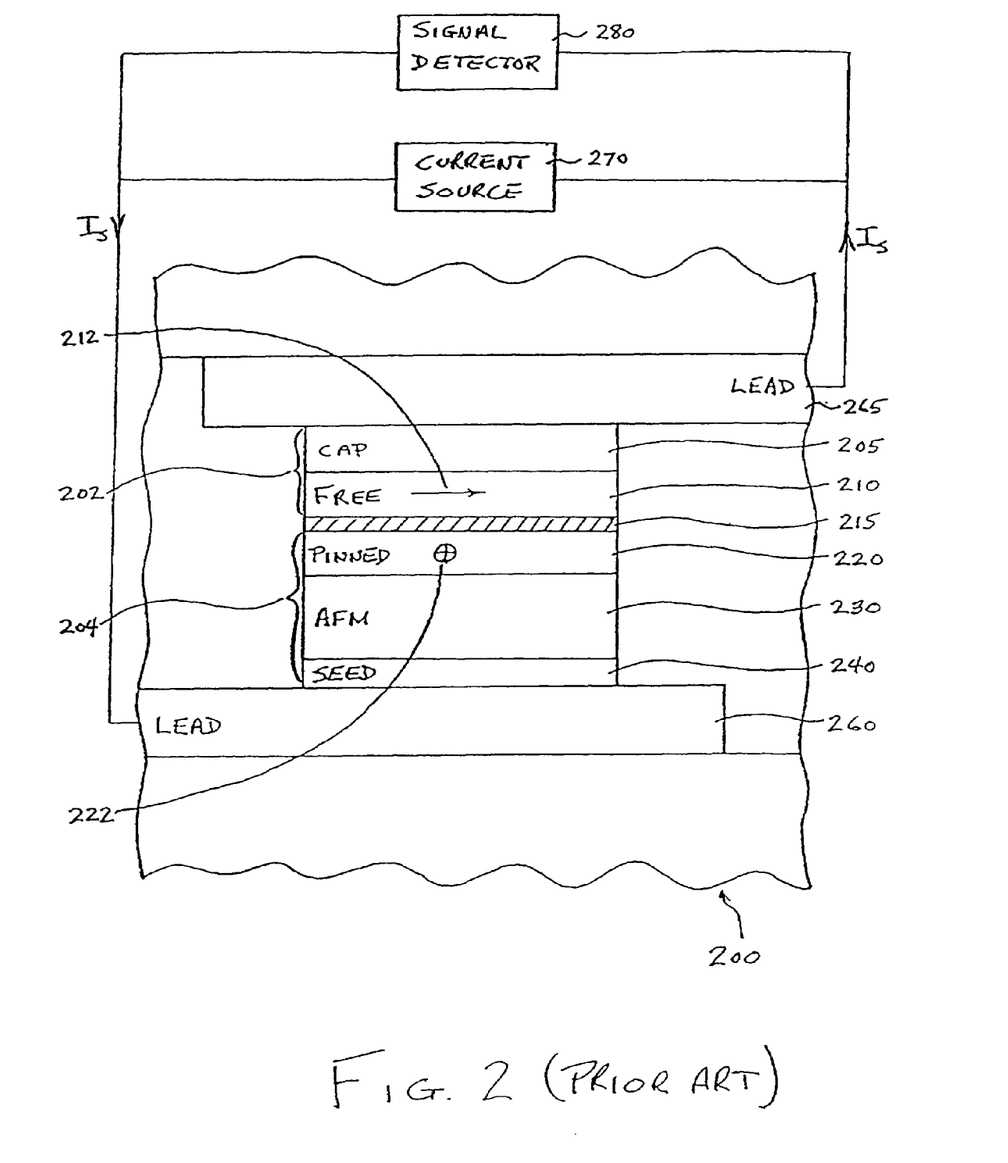
FIG. 2 is an air bearing surface view, not to scale, of a prior art magnetic tunnel junction sensor.

FIG. 2 shows a prior art MTJ sensor 200 comprising a first electrode 204, a second electrode 202, and a tunnel barrier layer 215. The first electrode 204 comprises a pinned layer (ferromagnetic pinned layer) 220, an antiferromagnetic (AFM) pinning layer 230, and a seed layer 240. The magnetization of the pinned layer 220 is fixed through exchange coupling with the AFM layer 230. The second electrode 202 comprises a free layer (ferromagnetic free layer) 210 and a cap layer 205. The free layer 210 is separated from the pinned layer 220 by a nonmagnetic, electrically insulating tunnel barrier layer 215. In the absence of an external magnetic field, the free layer 210 has its magnetization oriented in the direction shown by arrow 212, that is, generally perpendicular to the magnetization direction of the pinned layer 220 shown by arrow 222 (tail of an arrow pointing into the plane of the paper). A first lead 260 and a second lead 265 formed in contact with first electrode 204 and second electrode 202, respectively, provide electrical connections for the flow of sensing current $I_s$ from a current source 270 to the MTJ sensor 200. Because the sensing current is perpendicular to the plane of the sensor layers, the MTJ sensor 200 is known as a current-perpendicular-to-plane (CPP) sensor. A signal detector 280, typically including a recording channel such as a partial-response maximum-likelihood (PRML) channel, connected to the first and second leads 260 and 265 senses the change in resistance due to magnetization changes induced in the free layer 210 by the external magnetic field.

Two types of current-perpendicular-to-plane (CPP) sensors have been extensively explored for magnetic recording at ultrahigh densities ($\geq 20$ Gb/in$^2$). One is a GMR spin valve sensor and the other is a MTJ sensor. Two challenging issues are encountered when the CPP sensor is used for ever increasing magnetic recording densities. First, the GMR coefficient may not be high enough to ensure adequate signal amplitude as the sensor width is decreased and second, magnetic stabilization of the sense layer can be difficult due to the use of insulating layers to avoid current shorting around the active region of the sensor. A dual CPP sensor can be used to provide increased magnetoresistive response to a signal field due to the additive response of the two sensors. IBM's U.S. Pat. No. 5,287,238 granted to Baumgart et al. discloses a dual CIP SV sensor. However, sensor stability still remains a major concern.

There is a continuing need to increase the GMR coefficient and reduce the thickness of GMR sensors while improving sensor stability. An increase in the GMR coefficient and reduced sensor geometry equates to higher bit density (bits/square inch of the rotating magnetic disk) read by the read head.

SUMMARY OF THE INVENTION

It is an object of the present invention to disclose a dual current-perpendicular-to-plane (CPP) spin valve (SV) sensor with improved sensor layer stabilization.

It is another object of the present invention to disclose a dual CPP SV sensor having a longitudinal bias stack between a first SV stack and a second SV stack to provide improved stabilization of the sense (free) layers of the first and second SV stacks.

It is a further object of the present invention to disclose a dual CPP SV sensor having a longitudinal bias stack comprising a first decoupling layer, a first ferromagnetic (FM1) layer, an antiferromagnetic (AFT) layer, a second ferromagnetic (FM2) layer and a second decoupling layer disposed between the sense layers of first and second SV stacks.

It is yet another object of the present invention to disclose a dual CPP SV sensor having a longitudinal bias stack disposed between first and second SV stacks to provide three flux closures for improved sensor stability. A first flux closure provides stability of the first SV stack, a second flux closure provides stability of the second SV stack, and a third flux closure provides cancellation of demagnetizing fields from first and second antiparallel (AP)-pinned layers of the dual SV sensor.

In accordance with the principles of the present invention, there is disclosed a preferred embodiment of the present invention wherein a dual CPP SV sensor comprises a first SV stack, a second SV stack and a longitudinal bias stack disposed between first and second sense layers of the dual SV sensor. The first SV stack comprises a first antiferromagnetic (AFM1) layer, a first AP-pinned layer, a first conductive spacer layer and a first sense layer. The second SV stack comprises a second antiferromagnetic (AFM2) layer, a second AP-pinned layer, a second conductive spacer layer and a second sense layer. The longitudinal bias stack comprises a third antiferromagnetic (AFM3) layer sandwiched between a first ferromagnetic (FM1) layer and a second ferromagnetic (FM2) layer, and first and second decoupling layers in laminar contact with the FM1 and FM2 layers, respectively.

The AFM1 and AFM2 layers are set by annealing the SV sensor at elevated temperature (about 280° C.) in a large magnetic field (about 10,000 Oe) oriented in a transverse direction perpendicular to an air bearing surface (ABS) to orient the magnetizations of the first and second AP-pinned layers. The AFM3 layer, formed of antiferromagnetic material having a lower blocking temperature (temperature at which the pinning field reaches zero Oe) than AFM1 and AFM2, is set by the annealing but is reset by a second annealing step at a lower temperature (about 240° C.) in a much smaller magnetic field (about 200 Oe) oriented in a longitudinal direction parallel to the ABS to reorient the magnetizations of the FM1 and FM2 layers from the transverse to the longitudinal direction without reorienting magnetizations of the first and second AP-pinned layers. After the two annealing steps, the magnetizations of the first and second AP-pinned layers are oriented perpendicular to the ABS with net magnetic moments canceling each other, and the magnetizations of the FM1 and FM2 layers are oriented in the longitudinal direction. The magnetization of the FM1 layer forms a flux closure with the magnetization of the first sense layer and the magnetization of the FM2 layer forms a flux closure with the magnetization of the second sense layer. The first and second sense layers can be stabilized through magnetostatic interactions induced from the first and second flux closures, respectively.

The above as well as additional objects, features, and advantages of the present invention will become apparent in the following detailed description.

BRIEF DESCRIPTION OF THE DRAWINGS

For a fuller understanding of the nature and advantages of the present invention, as well as the preferred mode of use, reference should be made to the following detailed description read in conjunction with the accompanying drawings. In the following drawings, like reference numerals designate like or similar parts throughout the drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 3:
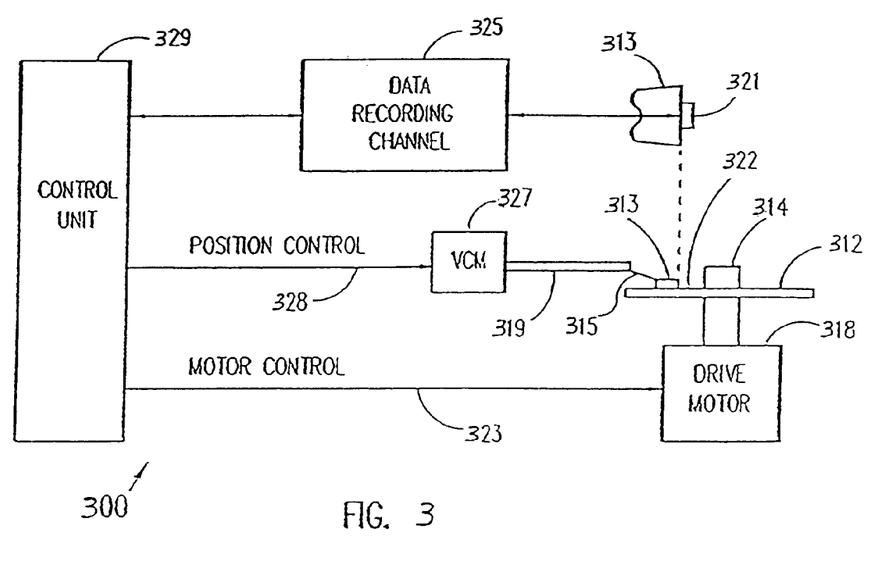
FIG. 3 is a simplified diagram of a magnetic recording disk drive system using the dual CPP SV sensor of the present invention.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on the disk 312.

At least one slider 313 is positioned on the disk 312, each slider 313 supporting one or more magnetic read/write heads 321 where the head 321 incorporates the dual SV sensor of the present invention. As the disks rotate, the slider 313 is moved radially in and out over the disk surface 322 so that the heads 321 may access different portions of the disk where desired data are recorded. Each slider 313 is attached to an actuator arm 319 by means of a suspension 315. The suspension 315 provides a slight spring force which biases the slider 313 against the disk surface 322. Each actuator arm 319 is attached to an actuator 327. The actuator as shown in FIG. 3 may be a voice coil motor (VCM). The VCM comprises a coil movable within a fixed magnetic field, the direction and speed of the coil movements being controlled by the motor current signals supplied by a controller 329.

During operation of the disk storage system, the rotation of the disk 312 generates an air bearing between the slider 313 (the surface of the slider 313 which includes the head 321 and faces the surface of the disk 312 is referred to as an air bearing surface (ABS)) and the disk surface 322 which exerts an upward force or lift on the slider. The air bearing thus counterbalances the slight spring force of the suspension 315 and supports the slider 313 off and slightly above the disk surface by a small, substantially constant spacing during normal operation.

The various components of the disk storage system are controlled in operation by control signals generated by the control unit 329, such as access control signals and internal clock signals. Typically, the control unit 329 comprises logic control circuits, storage chips and a microprocessor. The control unit 329 generates control signals to control various system operations such as drive motor control signals on line 323 and head position and seek control signals on line 328. The control signals on line 328 provide the desired current profiles to optimally move and position the slider 313 to the desired data track on the disk 312. Read and write signals are communicated to and from the read/write heads 321 by means of the recording channel 325. Recording channel 325 may be a partial response maximum likelihood (PMRL) channel or a peak detect channel. The design and implementation of both channels are well known in the art and to persons skilled in the art. In the preferred embodiment, the recording channel 325 is a PMRL channel.

The above description of a typical magnetic disk storage system, and the accompanying illustration of FIG. 3 are for representation purposes only. It should be apparent that disk storage systems may contain a large number of disks and actuator arms, and each actuator arm may support a number of sliders.

Figure 4:
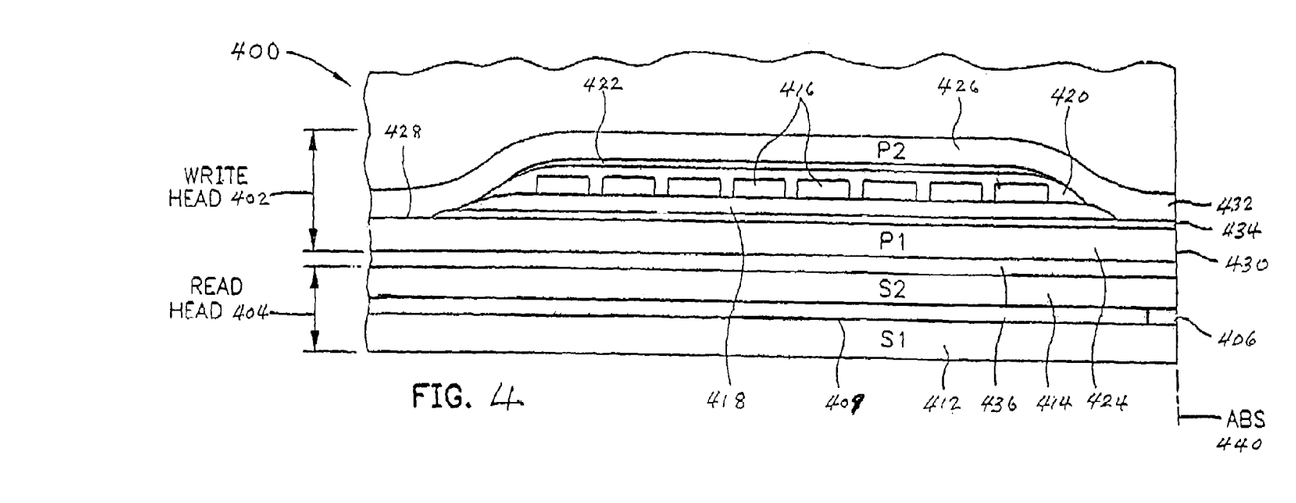
FIG. 4 is a vertical cross-section view, not to scale, of a "piggyback" read/write head.

FIG. 4 is a side cross-sectional elevation view of a "piggyback" read/write head 400, which includes a write head portion 402 and a read head portion 404, the read head portion employing a dual SV sensor 406 according to the present invention. The SV sensor 406 is sandwiched between ferromagnetic first and second shield layers 412 and 414 at the ABS 440. A nonmagnetic insulating layer 409 is sandwiched between the first and second shield layers 412 and 414 in the region behind the sensor extending away from the ABS to prevent shorting between the shield layers. In response to external magnetic fields, the resistance of the SV sensor 506 changes. A sense current is conducted through the sensor causes these resistance changes to be manifested as voltage changes. These voltage changes are then processed as readback signals by the processing circuitry of the data recording channel 325 shown in FIG. 3.

The write head portion 402 of the magnetic read/write head 400 includes a coil layer 416 sandwiched between first and second insulating layers 418 and 420. A third insulating layer 422 may be employed for planarizing the head to eliminate ripples in the second insulating layer 420 caused by the coil layer 416. The first, second and third insulating layers are referred to in the art as an insulation stack. The coil layer 416 and the first, second and third insulating layers 418, 420 and 422 are sandwiched between first and second pole piece layers 424 and 426. The first and second pole piece layers 424 and 426 are magnetically coupled at a back gap 428 and have first and second pole tips 430, 432 which are separated by a write gap layer 434 at the ABS 440. An insulating layer 436 is located between the second shield layer 414 and the first pole piece layer 424. Since the second shield layer 414 and the first pole piece layer 424 are separate layers, this read/write head is known as a "piggyback" read/write head.

Figure 5:
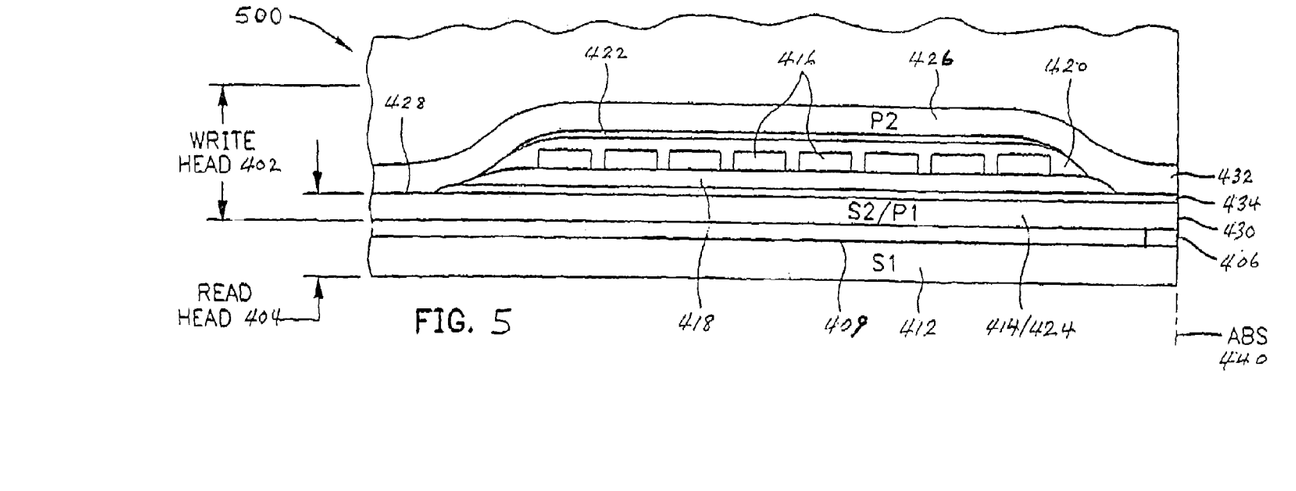
FIG. 5 is a vertical cross-section view, not to scale, of a "merged" read/write head.

FIG. 5 is the same as FIG. 4 except the second shield layer 414 and the first pole piece layer 424 are a common layer. This type of read/write head is known as a "merged" head 500. The insulation layer 436 of the piggyback head in FIG. 4 is omitted in the merged head 500 of FIG. 5.

FIRST EXAMPLE

Figure 6:
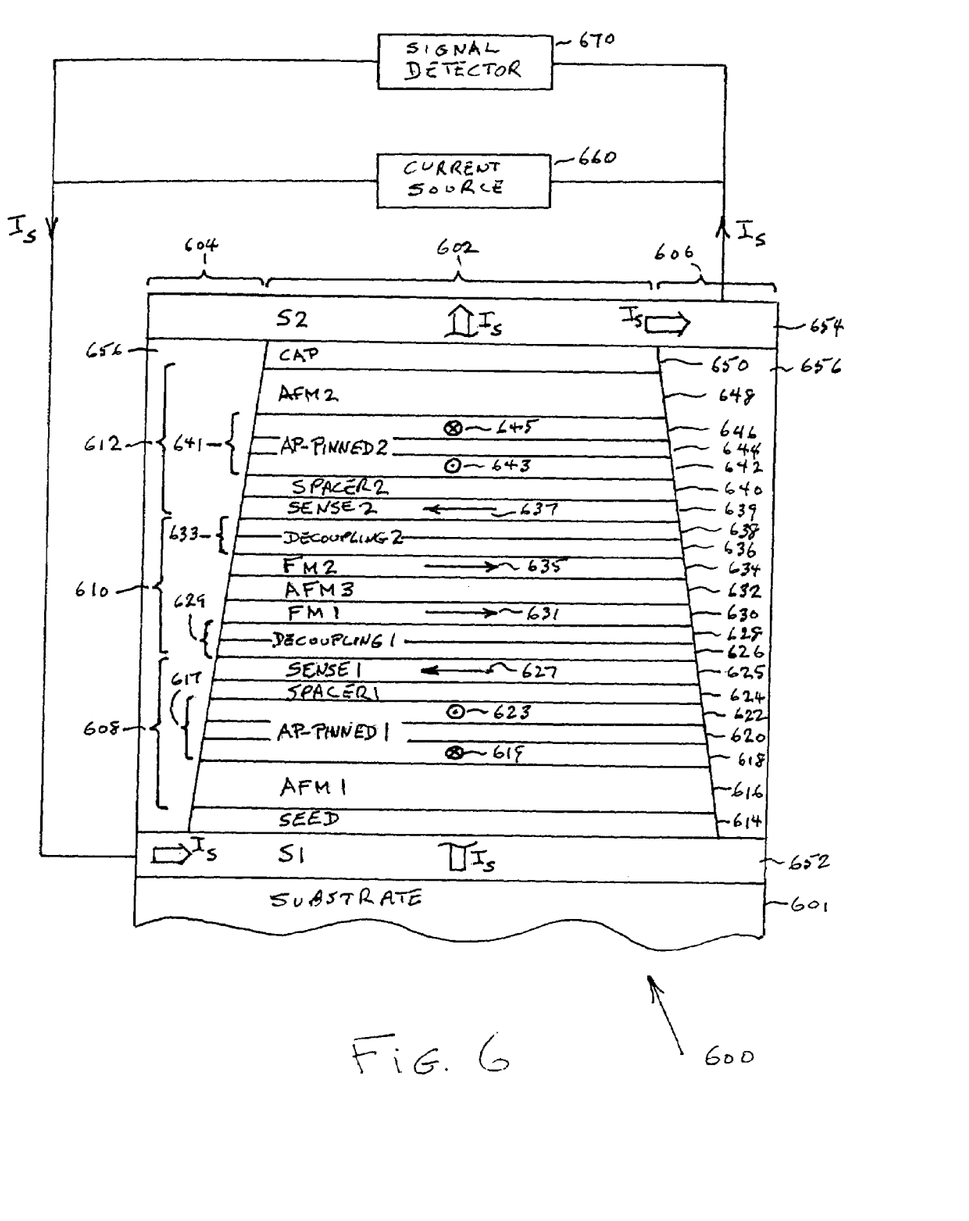
FIG. 6 is an air bearing surface view, not to scale, of a preferred embodiment of a dual CPP SV sensor according to the present invention.

FIG. 6 shows an air bearing surface (ABS) view, not to scale, of a dual CPP spin valve (SV) sensor 600 according to a preferred embodiment of the present invention. The SV sensor 600 comprises end regions 604 and 606 separated from each other by a central region 602. The seed layer 614 is a layer deposited to modify the crystallographic texture or grain size of the subsequent layers, and may not be needed depending on the subsequent layer. A first SV stack 608 deposited over the seed layer 614 comprises a first antiferromagnetic (AFM1) layer 616, a first AP-pinned layer 617, an conductive first spacer layer 624 and a first sense layer 625. The first AP-pinned layer 617 is formed of two ferromagnetic layers 618 and 622 separated by an antiparallel coupling (APC) layer 620. The APC layer is formed of a nonmagnetic material, preferably ruthenium (Ru), that allows the two ferromagnetic layers 618 and 622 to be strongly antiparallel-coupled together. The AFM1 layer 616 has a thickness at which the desired exchange properties are achieved, typically 100-300 Å.

A longitudinal bias stack 610 sequentially deposited over the first SV stack 608 comprises a first decoupling layer 629, a first ferromagnetic (FM1) layer 630, a third antiferromagnetic (AFM3) layer 632, a second ferromagnetic (FM2) layer 634 and a second decoupling layer 633. A second SV stack 612 deposited over the longitudinal bias stack 610 comprises a second sense layer 639, a second conductive spacer layer 640, a second AP-pinned layer 641 and a second antiferromagnetic (AFM2) layer 648. The second AP-pinned layer 641 is formed of two ferromagnetic layers 642 and 646 separated by an antiparallel coupling (APC) layer 644. The APC layer is formed of a nonmagnetic material, preferably ruthenium (Ru), that allows the two ferromagnetic layers 642 and 646 to be strongly anti-parallel coupled together. The AFM2 layer 648 has a thickness at which the desired exchange properties are achieved, typically 100-300 Å. A cap layer 650, formed on the AFM2 layer 648, completes the central region 602 of the dual SV sensor 600.

The AFM1 layer 616 is exchange-coupled to the first AP-pinned layer 617 to provide a pinning field to pin the magnetizations of the two ferromagnetic layers of the first AP-pinned layer perpendicular to the ABS as indicated by an arrow tail 619 and an arrow head 623 pointing into and out of the plane of the paper, respectively. The first sense layer 625 has a magnetization 627 that is free to rotate in the presence of an external (signal) magnetic field. The magnetization 627 of the first sense layer 625 is preferably oriented parallel to the ABS in the absence of an external magnetic field.

The AFM2 layer 648 is exchange coupled to the second AP-pinned layer 641 to provide a pinning magnetic field to pin the magnetizations of the two ferromagnetic layers of the second AP-pinned layer perpendicular to the ABS as indicated by an arrow head 643 and an arrow tail 645 pointing out of and into the plane of the paper, respectively. The second sense layer 639 has a magnetization 637 that is free to rotate in the presence of an external (signal) magnetic field. The magnetization 637 of the second sense layer 639 is preferably oriented parallel to the ABS in the absence of an external magnetic field.

The AFM3 layer 632 is exchange coupled to the FM1 layer 630 and the FM2 layer 634 to provide pinning fields to pin the magnetizations 631 and 635, respectively, parallel to the plane of the ABS. The magnetizations 631 and 635 provide longitudinal bias fields which form flux closures with the first and second sense layers 625 and 639, respectively, to stabilize the first and second sense layers 625 and 639.

First and second shield layers 652 and 654 adjacent to the seed layer 614 and the cap layer 650, respectively, provide electrical connections for the flow of a sensing current Is from a current source 660 to the SV sensor 600. A signal detector 670 which is electrically connected to the first and second shield layers 652 and 654 senses the change in resistance due to changes induced in the sense layers 625 and 639 by the external magnetic field (e.g., field generated by a data bit stored on a disk). The external field acts to rotate the magnetizations of the sense layers 625 and 639 relative to the magnetizations of the pinned layers 622 and 642 which are preferably pinned perpendicular to the ABS. The signal detector 670 preferably comprises a partial response maximum likelihood (PRML) recording channel for processing the signal detected by SV sensor 600. Alternatively, a peak detect channel or a maximum likelihood channel (e.g., 1,7 ML) may be used. The design and implementation of the aforementioned channels are known to those skilled in the art. The signal detector 670 also includes other supporting circuitries such as a preamplifier (electrically placed between the sensor and the channel) for conditioning the sensed resistance changes as is known to those skilled in the art.

The SV sensor 600 is fabricated in an integrated ion beam/DC magnetron sputtering system to sequentially deposit the multilayer structure shown in FIG. 6. The sputter deposition process is carried out in the presence of a longitudinal magnetic field of about 40 Oe. The first shield layer 652 formed of Ni—Fe having a thickness of 10000 Å is deposited on a substrate 601. The seed layer 614 is a bilayer with a first sublayer of tantalum (Ta) having a thickness of 30 Å and a second sublayer of Ni—Fe having a thickness of 10 Å deposited on the first shield layer 652. The first SV stack 608 is formed on the seed layer by sequentially depositing the AFM1 layer 616 of Pt—Mn having a thickness of about 160 Å, the ferromagnetic layer 618 of Co—Fe having a thickness of about 12 Å, the APC layer 620 of ruthenium (Ru) having a thickness of about 8 Å, the ferromagnetic layer 622 of Co—Fe having a thickness of about 18 Å, the conductive first spacer layer 624 of Cu—O having a thickness of about 22 Å, and the first sense layer 625 of Co—Fe having a thickness of about 18 Å. The first spacer layer 624 is formed by depositing a copper (Cu) film with DC-magnetron sputtering from a pure Cu target in a mixture of argon and oxygen gases of 2.985 and 0.015 mTorr, respectively, and then exposing to a mixture of argon and oxygen gases of 2.94 and 0.06 mTorr, respectively, for 4 minutes. This optimum in situ oxidation is incorporated into this Cu—O formation process for reducing ferromagnetic coupling between the sense and pinned layers.

The longitudinal bias stack 610 is formed on the first SV stack 608 by sequentially depositing the first decoupling layer 629 comprising a first sublayer 626 of Cu—O having a thickness of about 10 Å and a second sublayer 628 of ruthenium (Ru) having a thickness of about 20 Å, the FM1 layer 630 of Co—Fe having a thickness of about 24 Å, the AFM3 layer 632 of Ir—Mn having a thickness of about 60 Å, the FM2 layer 634 of Co—Fe having a thickness of about 24 Å, and the second decoupling layer 633 comprising a first sublayer 636 of ruthenium (Ru) having a thickness of about 20 Å and a second sublayer 638 of Cu—O having a thickness of about 10 Å. The Cu—O sublayers 626 and 638 are formed by depositing a copper (Cu) film with DC-magnetron sputtering from a pure Cu target in a mixture of argon and oxygen gases of 2.985 and 0.015 mTorr, respectively, and then exposing to a mixture of argon and oxygen gases of 2.94 and 0.06 mTorr, respectively, for 4 minutes. The Cu—O films facilitate the sense layers to exhibit good soft magnetic properties.

The second SV stack 612 is formed on the longitudinal bias stack 610 by sequentially depositing the second sense layer 639 of Co—Fe having a thickness of about 18 Å, the conductive second spacer layer 640 of Cu—O having a thickness of about 22 Å, the ferromagnetic layer 642 of Co—Fe having a thickness of about 18 Å, the APC layer 644 of ruthenium (Ru) having a thickness of about 8 Å, the ferromagnetic layer 646 of Co—Fe having a thickness of about 12 Å, and the AFM2 layer 648 of Pt—Mn having a thickness of about 160 Å. The spacer layer 640 is formed by depositing a copper (Cu) film with DC-magnetron sputtering from a pure Cu target in a mixture of argon and oxygen gases of 2.985 and 0.015 mTorr, respectively, and then exposing to a mixture of argon and oxygen gases of 2.94 and 0.06 mTorr, respectively, for 4 minutes. This optimum in situ oxidation is incorporated into this Cu—O formation process for reducing ferromagnetic coupling fields between the sense and pinned layers. The cap layer 650 is a bilayer with a first sublayer of ruthenium (Ru) having a thickness of 40 Å and a second sublayer of tantalum (Ta) having a thickness of 30 Å formed over the AFM2 layer 648.

The second shield layer 654 formed of Ni—Fe having a thickness of 10000 Å is deposited over the cap layer 650. An insulating layer 656 formed of $Al_2O_3$ deposited between the first shield layer 652 and the second shield layer 654 provides electrical insulation between the shields/leads and prevents shunting of the sense current around the active region 602 of the dual SV sensor 600.

After the deposition of the central portion 602 is completed, the SV sensor is annealed for 2 hours at 280° C. in the presence of a magnetic field of about 10,000 Oe in a transverse direction perpendicular to the ABS and is then cooled while still in the magnetic field to set the exchange coupling of the AFM1 and AFM2 layers 616 and 648 with the AP-pinned layers 617 and 641, respectively, so that the magnetizations in the two AP-pinned layers are perpendicular to the ABS with net magnetic moments canceling each other. This results in cancellation of the demagnetization fields between the AP-pinned layers 617 and 641.

After the first anneal, a second anneal is carried out for 2 hours at 240° C. in the presence of a magnetic field of 200 Oe in a longitudinal direction parallel to the ABS. Because the blocking temperature of the Pt—Mn antiferromagnetic material (>360° C.) of the AFM1 and AFM2 layers is higher than 240° C., the magnetizations of the first and second AP-pinned layers 617 and 641 are not rotated while the magnetizations 631 and 635 in the longitudinal bias stack are oriented in the longitudinal direction due to the lower (less than 240° C.) blocking temperature of the Ir—Mn antiferromagnetic material of the AFM3 layer. After the second anneal, the magnetization 631 of the FM1 layer 630 forms a flux closure with the magnetization 627 of the first sense layer 625 providing stability for the first sense layer 625. Similarly, the magnetization 635 of the FM2 layer 634 forms a flux closure with the magnetization 637 of the second sense layer 639 providing stability of the second sense layer 639.

The Cu—O/Ru and Ru/Cu—O films are used as first and second decoupling layers 629 and 633. Either one of the Cu—O or Ru films is not used alone as a decoupling layer since strong exchange coupling occurs across either film and full decoupling can only be attained when the film thickness is far greater than 30 Å. In order to attain strong magnetostatic interactions from the flux closures, the decoupling layer thickness is preferred to be as small as possible, but not to be too small to induce the exchange coupling. The Cu—O film of the decoupling layers is adjacent to the Co—Fe sense layers to promote good soft magnetic properties. The Ru film of the decoupling layers is also used as a seed layer for the Co—Fe/Ir—Mn/Co—Fe longitudinal bias layers to promote high unidirectional anisotropy fields ($H_{UA}$).

In this preferred embodiment, the Co—Fe/Ir—Mn/Co—Fe film stack is used for antiferromagnetic stabilization of the dual SV sensors. Alternatively, a Ni—Fe(10 Å/Co—Pt(40 Å)/Ni—Fe(10 Å) film stack can be used to replace the Co—Fe/Ir—Mn/Co—Fe film stack for hard magnetic stabilization. The Ni—Fe film is adjacent to the Co—Pt film in order to reduce stray fields from the Co—Pt film and improve its squareness. In this alternate embodiment, the second anneal used to longitudinally orient the magnetizations of the Co—Fe/Ir—Mn/Co—Fe stack is eliminated, but magnetic setting of the Ni—Fe/Co—Pt/Ni—Fe stack in a field of 3 kOe must be conducted at room temperature after the head fabrication process.

SECOND EXAMPLE

Figure 7:
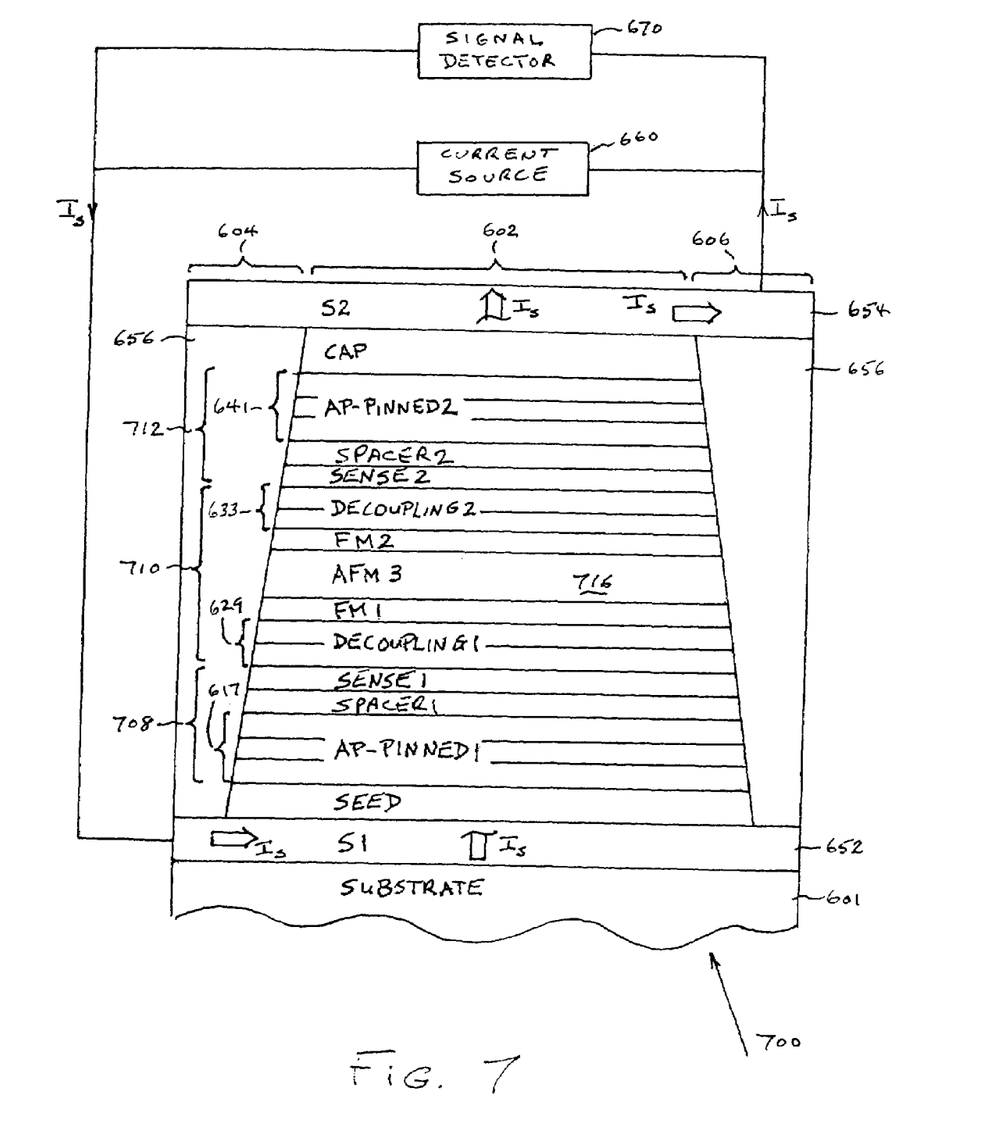
FIG. 7 is an air bearing surface view, not to scale, of another embodiment of a dual CPP SV sensor according to the present invention.

FIG. 7 shows an air bearing surface (ABS) view, not to scale, of a CPP dual spin valve (SV) sensor 700 according to another embodiment of the present invention. The dual SV sensor 700 is the same as the dual SV sensor 600 shown in FIG. 6 except that in order to achieve a read gap thickness of 50 nm the AFM1 and AFM2 layers 616 and 648 have been eliminated and the AFM3 layer 632 of the longitudinal bias stack 610 has been replaced by an AFM3 layer 716 of Pt—Mn having a thickness of 160 Å. The dual SV sensor 700 comprises a first SV stack 708, a second SV stack 712 and a longitudinal bias stack 710 disposed between the first and second SV stacks 708 and 712. In this embodiment the first SV stack 708 is the same as SV stack 608 without the AFM1 layer 616 and the second SV stack 712 is the same as SV stack 612 without the AFM2 layer 648. The longitudinal bias stack 710 is the same as bias stack 610 with the AFM3 layer of Ir—Mn replaced with an AFM3 layer 716 of Pt—Mn having a thickness of 160 Å.

The SV sensor 700 is fabricated in an integrated ion beam/DC magnetron sputtering system to sequentially deposit the multilayer structure shown in FIG. 7. The deposition process is the same as the process used to fabricate the SV sensor 600.

After the deposition of the central portion 602 is completed, the SV sensor 700 is annealed for 2 hours at 280° C. in the presence of a magnetic field of 200 Oe in a longitudinal direction parallel to the ABS. The magnetic field is higher than the uniaxial anisotropy field $H_K$ ($\leqq 20$ Oe) of the as-deposited Co—Fe/Pt—Mn/Co—Fe films so that strong exchange coupling in the Co—Fe/Pt—Mn/Co—Fe films can be developed in the longitudinal direction parallel to the ABS during annealing. The magnetic field is less than the spin flop field $H_{SF}$ ($\geqq 1$ kOe) of the first and second AP-pinned layers 617 and 641 so that strong antiparallel coupling across the Ru APC layers in the first and second AP-pinned layers 617 and 641 is not interrupted during annealing.

Although the Pt—Mn AFM layers are not used in the first and second SV stacks 708 and 712 to produce $H_{UA}$ for transverse pinning, the transverse pinning can still be attained due to a strong spin-flop field ($H_{SF}$) induced from antiparallel coupling across the Ru APC layers. The transverse pinning can be further reinforced if the Co—Fe films adjacent to the Ru APC layers have a high intrinsic uniaxial anisotropy field ($H_K$) and a high positive saturation magnetostriction ($\lambda_S$). The high $\lambda_S$ is needed to stress-induce a high extrinsic uniaxial anisotropy field ($H_K'$), determined from $H_K'=3(\lambda_S/M_S)\sigma$ after sensor lapping. The $Co_{90}$—$Fe_{10}$ (in atomic %) commonly used for the ferromagnetic layers of the AP-pinned layers 617 and 641 has an $H_K$ of 16 Oe. When the Fe content is increased to 20 at. %, $H_K$ becomes 30 Oe and the $\lambda_S$ increases to 35.1× $10^{-6}$ (corresponding to 142 Oe). Hence, in this alternative embodiment, a Co—Fe film with an Fe content of 20 at. % or higher (up to 50 at. %) is preferably used for the ferromagnetic layers of the AP-pinned layers.

Although the total uniaxial anisotropy field $H_K+H_K'$ (172.5 Oe) is not as high as $H_{UA}$ (600 Oe) and $H_{SP}$ (900 Oe), it has two major unique features, leading it to play an important role in providing transverse pinning. First, $H_K+H_K'$ is determined only from the Co—Fe film itself, while $H_{UA}$ and $H_{SP}$ are determined not only from the Co—Fe film, but also from its adjacent Ru and Pt—Mn films. As a result, the temperature dependence of $H_K+H_K'$ is determined by the Curie temperature of the Co—Fe film (~700° C.), while the temperature dependence of $H_{UA}$ is determined by the blocking temperature of the exchange-coupled Pt—Mn/Co—Fe films (~360° C.), and the temperature dependence of $H_{sp}$ is determined by the critical temperature of the antiparallel-coupled Co—Fe/Ru/Co—Fe films. Since the Curie temperature is much higher than the blocking and critical temperatures, $H_K+H_K'$ can remain nearly unchanged at elevated sensor operation temperatures (~180° C.). Thus $H_K+H_K'$ may play a crucial role in improving thermal stability. Second, $H_K+H_K'$ substantially reduces edge curling effects of magnetizations of the ferromagnetic films of the AP-pinned layers. The reduction in the edge curling effects results in more uniform magnetization along the sensor height, therefore providing better flux closure to cancel magnetization more efficiently. Hence, even without the use of the Pt—Mn film for transverse pinning, the transverse pinning field resulting from $H_{SP}$, $H_K$ and $H_K'$ should be high enough for proper sensor operation.

THIRD EXAMPLE

Figure 8:
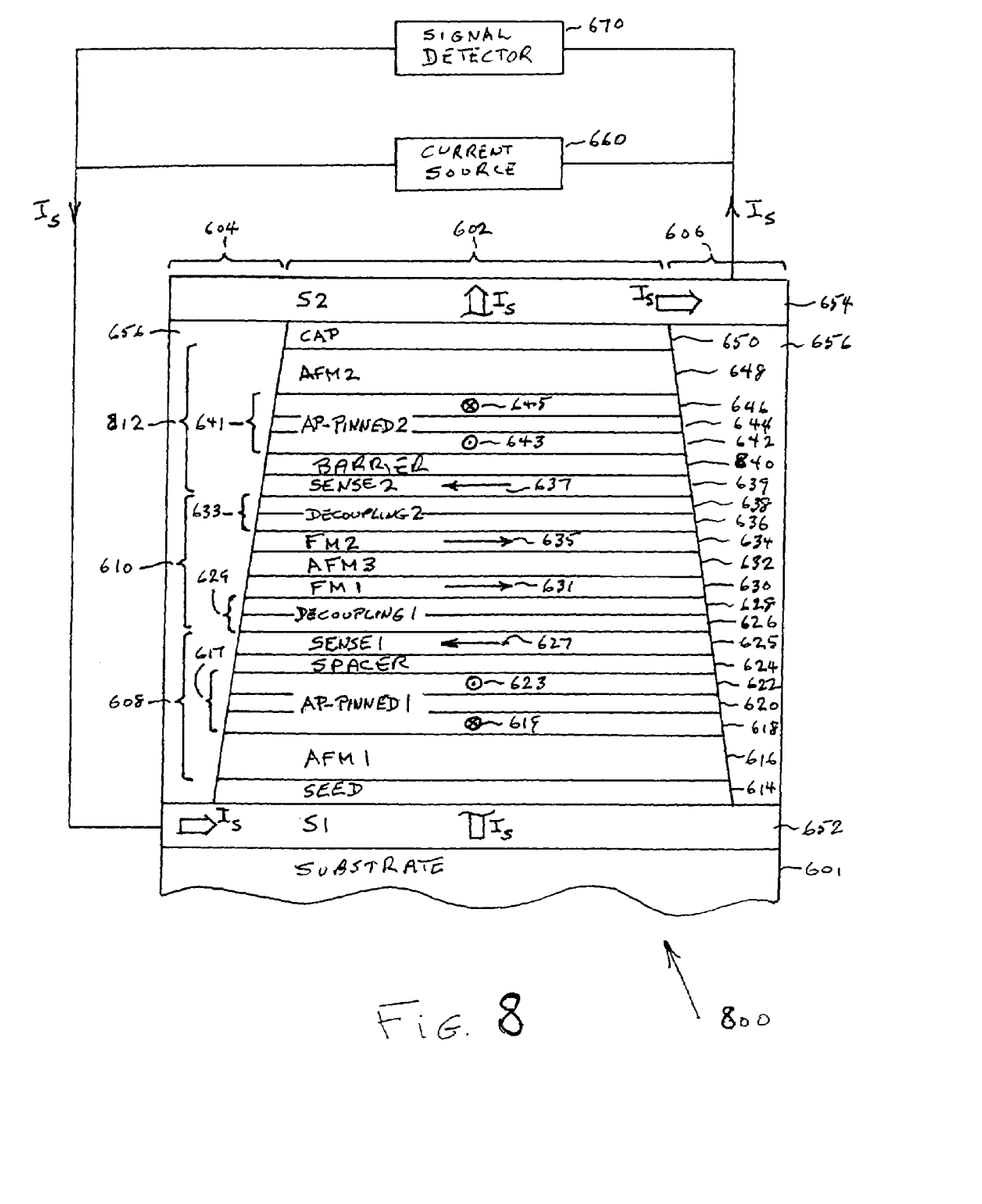
FIG. 8 is an air bearing surface view, not to scale, of an embodiment of a hybrid SV/MTJ sensor according to the present invention.

FIG. 8 shows an air bearing surface (ABS) view, not to scale, of a CPP hybrid spin valve (SV)/magnetic tunnel junction (MTJ) sensor 800 according to a another embodiment of the present invention. The hybrid SV/MTJ sensor 800 is the same as the dual SV sensor 600 shown in FIG. 6 except that one of the two SV stacks 608 and 612 is replaced with a magnetic tunnel junction (MTJ) stack. In the embodiment shown in FIG. 8, the second SV stack 612 has been replaced with an MTJ stack 812. However, alternatively, the first SV stack 608 may be replaced with an MTJ stack to form an alternative hybrid MTJ/SV sensor.

The SV/MTJ sensor 800 comprises an SV stack 608, an MTJ stack 812 and a longitudinal bias stack 610 disposed between the SV stack 608 and the MTJ stack 812. In this embodiment the SV stack 608 and the longitudinal bias stack 610 are identical to the first SV and longitudinal bias stacks of the preferred embodiment shown in FIG. 6. The MTJ stack 812 deposited over the longitudinal bias stack 610 comprises a second sense layer 639, a nonconductive tunnel barrier layer 840, a second AP-pinned layer 641 and a second antiferromagnetic (AFM2) layer 648. Only the tunnel barrier layer 840 which replaces the conductive second spacer layer 640 of the SV sensor 600 is different from the layers forming the SV sensor 640. The tunnel barrier layer 840 of Al—O having a thickness of about 6 Å is formed on the second sense layer 639 by depositing an aluminum (Al) film with DC-magnetron sputtering from a pure Al target in an argon gas of 3 mTorr, and then exposing to an oxygen gas of 2 Torr for 4 minutes. This optimal in situ oxidation is incorporated into this Al—O formation process for attaining a high tunneling magnetoresistance and a low junction resistance. The second AP-pinned layer 641 and the AFM2 layer 648 are sequentially deposited on the tunnel junction layer 840 to complete the fabrication of the MTJ stack 612. All other processing steps are identical to those described above with respect to fabrication of the SV sensor 600. The response of the hybrid dual SV/MTJ sensor 800 to an external magnetic signal is the sum of the response of the SV stack 608 and the response of the MTJ stack 812.

Alternatively, for the hybrid MTJ sensor 800, the AFM1 and AFM2 layers formed of Pt—Mn used in the first and second stacks can be eliminated, and the Ir—Mn film used for AFM3 in the longitudinal bias stack may also be replaced with a Pt—Mn film as described in the second example.

While the present invention has been particularly shown and described with reference to the preferred embodiments, it will be understood by those skilled in the art that various changes in form and detail may be made without departing from the spirit, scope and teaching of the invention. Accordingly, the disclosed invention is to be considered merely as illustrative and limited only as specified in the appended claims.

We claim:

1. A method of fabricating a dual spin valve (SV) sensor which comprises the steps of:
   sputter depositing the multilayer dual SV sensor including a first spin valve (SV) stack, a second spin valve (SV) stack and a longitudinal bias stack disposed between the first and second SV stacks the first spin valve stack including a first magnetic free layer, and the second spin valve stack including a second magnetic free layer;
   wherein said depositing a longitudinal bias stack further comprises:
      depositing a first decoupling layer adjacent to the first magnetic free layer;
      depositing a first ferromagnetic layer;
      depositing a layer of antiferromagnetic material;
      depositing a second ferromagnetic layer; and
      depositing a second decoupling layer;
      the first decoupling layer being deposited to such a thickness to magnetostatically couple the first ferromagnetic layer and the first magnetic free layer and sufficiently thick to avoid exchange coupling the first ferromagnetic layer with the first magnetic free layer;
      the second decoupling layer being deposited to such a thickness to magnetostatically couple the second ferromagnetic layer and the second magnetic free layer and sufficiently thick to avoid exchange coupling the second ferromagnetic layer with the second magnetic free layer;
   annealing the dual SV sensor at a first temperature in a first magnetic field oriented in a transverse direction perpendicular to an air bearing surface; and
   annealing the dual SV sensor at a second temperature in a second magnetic field oriented in a longitudinal direction parallel to said air bearing surface, wherein said second temperature is less than said first temperature and said second magnetic field has a magnitude smaller than said first magnetic field.

2. The method of fabricating a dual SV sensor as recited in claim 1, wherein said first temperature is about 280 C. and said second temperature is about 240 C.

3. The method of fabricating a dual SV sensor as recited in claim 1, wherein sad first magnetic field has a magnitude of about 10,000 Oe and said second magnetic field has a magnitude of about 200 Oe.

4. A method as recited in claim 1 wherein said first and second decoupling layers each comprise; a layer of Cu—O and a layer of Ru.

5. A method as recited in claim 1 wherein said first and second ferromagnetic layers comprise Co—Fe.

6. A method as recited in claim 1 wherein said layer of antiferromagnetic material comprises Ir—Mn.

7. A method as recited as recited in claim 1 wherein said step of depositing a dual spin valve sensor comprises DC-magnetron sputtering.

8. A method as recited in claim 4 wherein said Cu—O layers are deposited by DC-magnetron sputtering using a Cu target in a mixture of argon and oxygen gases.

* * * * *